(12) United States Patent  (10) Patent No.: US 6,680,501 B2
Ito et al.  (45) Date of Patent: Jan. 20, 2004

(54) SEMICONDUCTOR DEVICE

(75) Inventors: Yutaka Ito, Hachioji (JP); Hidetoshi Iwai, Fussa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/091,488

(22) Filed: Mar. 7, 2002

(65) Prior Publication Data

US 2002/0134997 A1 Sep. 26, 2002

(30) Foreign Application Priority Data

Mar. 23, 2001 (JP) ........................................ 2001-084037

(51) Int. Cl.$^7$ ............................................. H01L 27/108
(52) U.S. Cl. ........................ 257/296; 257/211; 257/390; 257/758; 257/316
(58) Field of Search ................................ 257/211, 296, 257/311, 202, 304, 305, 316, 314, 390, 758

(56) References Cited

U.S. PATENT DOCUMENTS 5,298,775 A * 3/1994 Ohya .......................... 257/211
5,780,890 A * 7/1998 Hazama ...................... 257/316

FOREIGN PATENT DOCUMENTS

| JP | 7-94597 | 4/1995 |
| JP | 7-254650 | 10/1995 |

* cited by examiner

*Primary Examiner*—Tuan H. Nguyen
(74) *Attorney, Agent, or Firm*—Antonelli, Terry, Stout & Kraus, LLP

(57) ABSTRACT

A memory cells are arranged at all intersections of a first word line and one line of a bit-line pair and all intersections of a second word line and the other line of the bit-line pair by arranging in parallel the first word line and the second word line consisting of different layers in the row direction with an identical pitch, and, also, alternately arranging the first word line and the second word line at an interval equal to a half of the pitch in the horizontal direction. Moreover, the selection MISFET of the memory cell is formed to have the vertical construction and the bit line located at the upper side of the substrate, where a channel region is formed, is shielded with a conductive film, a part of which forms the gate electrode.

27 Claims, 16 Drawing Sheets

SEMICONDUCTOR DEVICE

BACKGROUND OF THE INVENTION

The present invention relates to a technique which may be suitably adapted to a semiconductor storage device and particularly to a semiconductor storage device including a DRAM (Dynamic Random Access Memory).

The DRAM following a 16K-generation device utilizing one-transistor/one-capacitor cell (hereinafter, abbreviated as 1T cell) introduces a low noise construction in which a pair-line is formed of bit lines connecting the identical numbers of memory cells and this pair-line is connected with sense amplifiers. Thereby, a low level signal appearing on one of the bit-line pair from the selected memory cells is discriminated stably. Namely, in a system called a differential sense system, only a difference voltage between the lines forming a pair is amplified, the identical voltage is canceled and only a signal is amplified in the sense amplifier.

Discrimination of binary information in the differential sense system is carried out through discrimination of polarity in which a reference is made to a voltage on one line of the bit line pair for comparison but this discrimination characteristic is closely related to a positional relationship of the bit line pair for the sense amplifier and therefore various bit-line arrangement methods have been proposed. As a typical bit-line arrangement method which has been used practically in the DRAM of 1T cell, an open bit-line arrangement and a fold-back bit-line arrangement have been proposed.

FIG. 17 shows an open bit-line arrangement constitution method in which an entire part is formed of two sets of cell array because one bit line is divided into two sections and these sections are used as a pair-line (formed of first bit line BL and second bit line /BL). In this open bit-line arrangement, memory cells are arranged at all intersections of the word line and bit line and thereby an area of the memory array can be relatively reduced. Therefore, this constitution method is suitable to obtain a chip of small area. For example, when the minimum design size is defined as F, the cell area can be set to $4F^2$.

However, since the bit-line pair exists on different cell arrays, noise generated on one cell array appears on only one of the bit-line pair, resulting in a demerit that the cell array is weak for noise. Moreover, since the sense amplifiers must be arranged at the central area of the bit-line while the electric characteristic of the bit-line pair is balanced, here rises a problem that there is no flexibility in the layout of the sense amplifiers.

FIG. 18 shows a fold-back bit-line arrangement construction method in which a bit-line pair is constructed within one cell array. In this fold-back bit-line arrangement, noise generated in one cell array appears on both lines of the bit-line pair, resulting in a merit that the cell array is superior in the noise resistance characteristic. Moreover, since the sense amplifier arrangement has reasonable flexibility, the layout design of sense amplifiers can be realized comparatively easier than the open bit-line arrangement.

However, since the memory cells can be arranged only a half of the intersections between the word line and bit line, here rises a problem that an area of memory array relatively increases and thereby the chip size becomes large. When the minimum design size is defined as F, the cell area can be expressed as $8F^2$ and the memory cell area becomes twice the area in the open bit-line arrangement.

As explained above, the open bit-line arrangement assures small memory array but is weak in noise, while the fold-back bit-line arrangement is superior in noise but cannot provide a small memory array. Accordingly, the fold-back bit-line arrangement having excellent noise resistance characteristic has been employed to the devices up to the 64K to 64 Mbit generations but for the devices after the 64 Mbit generations, reduction of cell area through improvement of circuit technology such as new bit line arrangement method and multi-division method is now investigated in addition to improvement of memory cell construction and progress of the scale-down processing technique.

For example, the official gazettes of the Japanese Unexamined Patent Application Publications No. Hei 7(1995)-94597 and No. Hei 7(1995)-254650 disclose the fold-back bit-line arrangement in which the bit lines are formed in two layers resulting in the cell area of $4F^2$ in order to realize reduction of noise and high density integration of memory cells. In this construction method, the memory cells are connected in the lower wiring side and a pair of the upper layer and lower layer wirings form the bit-line pair in order to form a fold-back bit-line arrangement. Moreover, for the purpose of lowering coupling noise between the bit lines, the connection change-over points are provided in a constant interval on the upper layer and lower layer wirings and the upper layer wiring and lower layer wiring are crossed at these change-over points.

SUMMARY OF THE INVENTION

However, the investigation by the inventors of the present invention has made it apparent that noise generated between bit lines easily appears on the memory cells and thereby problems such as destruction of cell information and drop of an S/N ratio of memory cells are generated because all memory cells are connected to the lower layer wiring forming one of the bit-line pair in the fold-back bit-line arrangement in which the bit lines are formed in two layers.

Moreover, since a crossing portion in which the third layer wiring is added is necessary to realize the three-dimensional crossing construction of the upper layer wiring and lower layer wiring, the number of the memory cells can be arranged which is twice compared with the existing fold-back bit-line arrangement, but a problem that efficiency of area reduction is deteriorated is still left unsolved.

Therefore, an object of the present invention is to provide the technique to realize a DRAM in which a cell area having reduced influence of the bit-line noise on the memory cells is defined to $4F^2$.

The above-mentioned and other objects and features will become apparent from the description of this specification and the accompanying drawings.

The typical invention among those disclosed in this specification will be briefly explained below.

The present invention comprises a plurality of bit-line pairs of the fold-back arrangement connected to sense amplifiers, a plurality of first word lines formed of the first wiring arranged in the direction crossing a plurality of bit-line pairs and a plurality of second words lines formed of the second wiring with these first word lines and second word lines arranged in parallel with the same pitch, wherein the first word lines and the second word lines are alternately arranged with the interval identical to ½ of the pitch in the horizontal direction, the memory cells are arranged at the intersections of the first word lines and one of the bit-line pair and the intersections of the second word lines and the other of the bit-line pair. The memory cell is formed of a semiconductor substrate in which a channel region is formed on the main surface thereof, a gate electrode arranged integrally via a gate insulation film in both sides in the row direction of the substrate and is always maintained at the voltage identical to that of the substrate, a bit line which is connected to the upper side of the substrate and extended in the column direction to form one or the other side of the bit-line pair and an accumulation node of a capacitor which is connected to the lower side of the substrate and is provided within a groove formed on the semiconductor substrate. A conductive film of the same layer as the gate electrode is arranged on the bit line via the insulation film, and both side surfaces in the row direction and upper surface of the bit line are shielded with a conductive film.

DETAILED DESCRIPTION OF THE PREFERRED EMBODIMENTS

Figure 1:
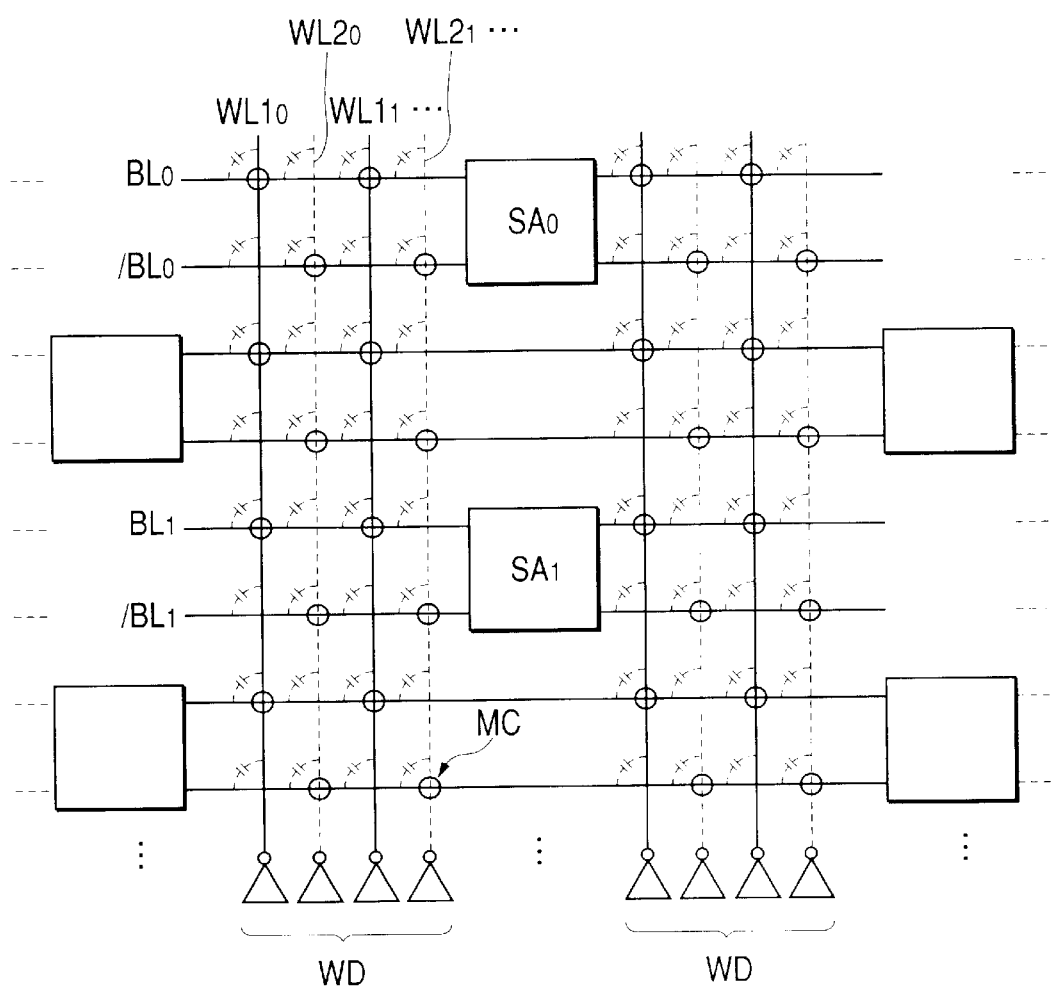
FIG. 1 is a diagram showing a cell arrangement of memory array of the DRAM of a first embodiment of the present invention.

The embodiments of the present invention will be explained in detail with reference to the accompanying drawings. The elements having like functions are designated with the like reference numerals throughout the drawings and the same explanation is omitted in this specification.

(Embodiment 1)

A memory array of DRAM is constructed by a plurality of word lines and a plurality of bit lines and a plurality of memory cells arranged at the intersections of these lines arranged in the shape of matrix. A memory cell for storing information of one bit is constructed by a capacitor and a selection MISFET (Metal Insulator Semiconductor Field Effect Transistor) connected in series to the capacitor. One of the source and drain of the selection MISFET is electrically connected with the capacitor, while the other is connected electrically with the bit line.

FIG. 1 shows a cell arrangement of a memory array of the DRAM as a first embodiment of the present invention.

For the memory cells MCs (illustrated as circle marks), the first word lines WL1s (WL1$_0$, WL1$_1$, ... ) are arranged in the row direction, while the second word lines WL2s (WL2$_0$, WL2$_1$, ... ) are arranged on the upper layer of the adjacent first word lines WL1s, and word drivers WDs are connected at each one end of the first word lines WL1s and second word lines WL2s. In the column direction, the first bit lines BLs (BL$_0$, BL$_1$, ... ) are arranged, the second bit lines /BLs (/BL$_0$, /BL$_1$, ... ) are also arranged in parallel and the first bit lines BLs and second bit lines /BLs form a plurality of pair-lines to be connected to the sense amplifiers SAs (SA0, SA1, ... ) to form the fold-back bit-line arrangement.

As explained above, since the memory cells MCs are arranged to all intersections of the first word lines WL1 and one of the bit-line pairs (intersections of the first word lines WL1s and the first bit lines BLs in the figure) and to all intersections of the second word lines WL2s and the other of the bit-line pairs (intersections of the second word lines WL2s and the second bit lines /BLs in the figure) by utilizing the first word lines WL1s and the second word lines WL2s formed of different layers, when the minimum design size is defined as F, the cell area can be set to 4F$^2$ which is identical to that of the open bit-line arrangement and thereby the intersection cells as many as 4F$^2$-2 can be realized.

In the embodiment 1, the memory cells have been arranged at the intersections of the first word lines WL1s and the first bit lines BLs and at the intersections of the second word lines WL2s and the second bit lines /BLs, but the present invention is never limited thereto and it is also possible to arrange the memory cells MCs to the intersections of the first word lines WL1s and the second bit lines /BLs and at the intersections of the second word lines WL2s and the first bit lines BLs.

Meanwhile, since noise generated within the cell array (a memory cell group in which the memory cells are arranged in the two dimensions of a matrix construction including the sub-arrays formed through multiple divisions of the memory array) appears on both lines of the bit-line pair connected to the sense amplifiers SAs by forming the bit-line pair with the first bit lines BLs and the second bit lines /BLs formed of the identical layer, the noise resistance characteristic can be maintained.

Figure 2:
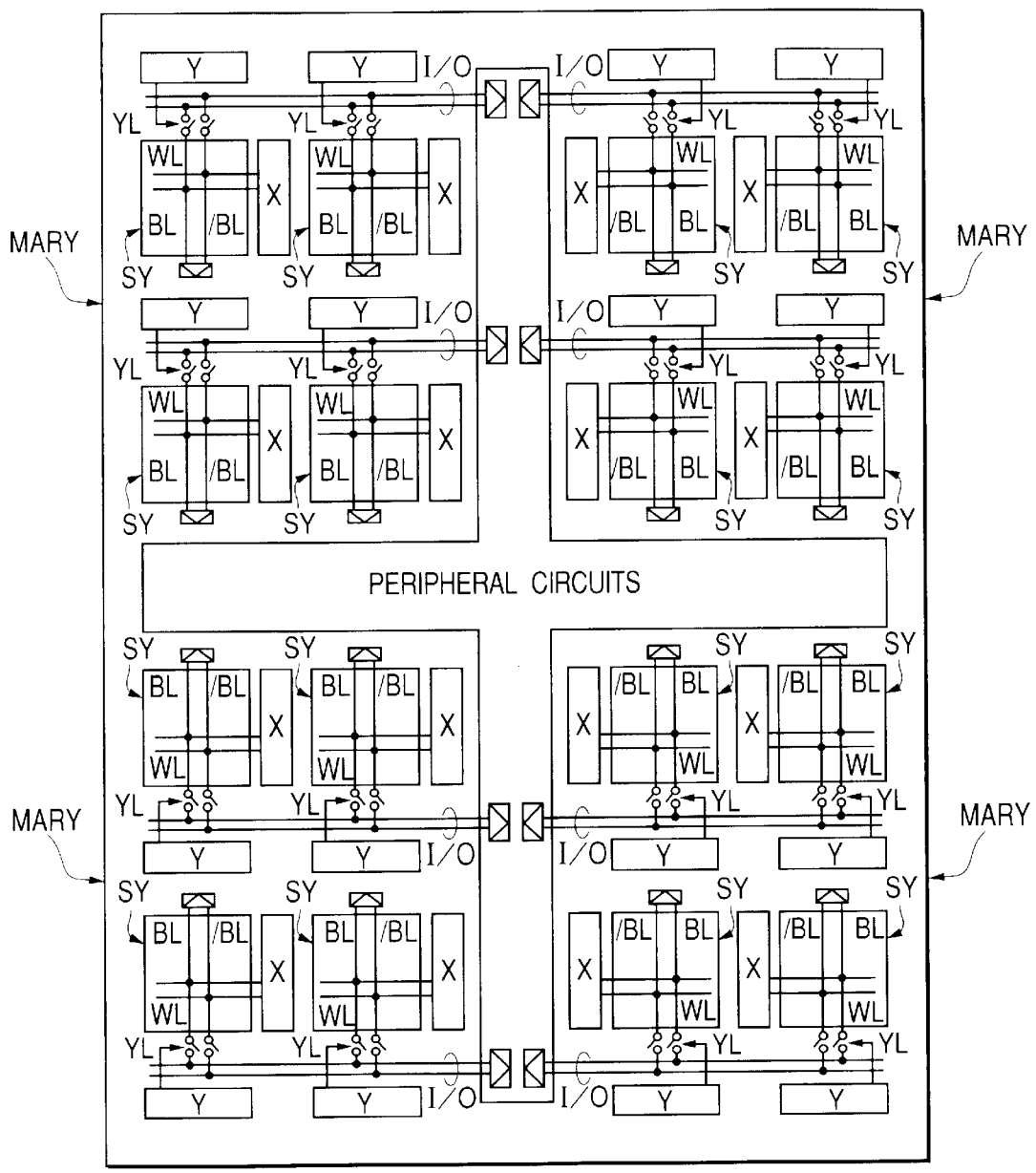
FIG. 2 is a schematic diagram showing an internal construction and intra-chip arrangement of memory array of the DRAM of the first embodiment.

FIG. 2 shows an example of the schematic diagram of internal construction and intra-chip arrangement of the memory array MARY of the embodiment 1. Here, the memory array MARY is simply divided into four sections in both row and column directions to form sub-arrays SYs and a decoder is also arranged for each division.

One sub-array SY is formed of n word lines WLs and m pairs of the first bit lines BLs and second bit lines /BLs which are arranged in the form of m×n matrix. Here, the n word lines WLs are formed of n/2 first word lines WL1s and n/2 second word lines WL2s arranged alternately. X and Y are decoder/driver for selectively driving these word lines WLs. The decoder respectively selects only one word line and bit line from the n rows and m column, while the driver receives an output of the decoder and supplies a selection pulse voltage to the word lines WL or column lines YL. In the peripheral portion of the memory array MARY, an input/output circuit and an indirect peripheral circuit are arranged.

The respective sub-arrays SYs are formed in the so-called non-hierarchical type word line construction in which only the n word lines WLs of which one end is connected to the word driver are arranged in the row direction. First, when the word lines WLs to which the memory cells to be selected are connected are selected, a selection pulse voltage is impressed thereto with the word driver connected to one end of the selected word lines WLs. Thereby, a small signal voltage is superimposed to a precharge voltage depending on an information voltage of the capacitor within the memory cell and this signal voltage appears on the bit-line pairs in the form of positive or negative voltage. This small positive or negative signal voltage is detected and amplified with a sense amplifier. The amplified voltage corresponding to this information is outputted to the I/O line by turning ON a column selection switch with a column selection signal and is then outputted to a bonding pad from a data output buffer of the peripheral circuit of a chip through a main amplifier.

Figure 3:
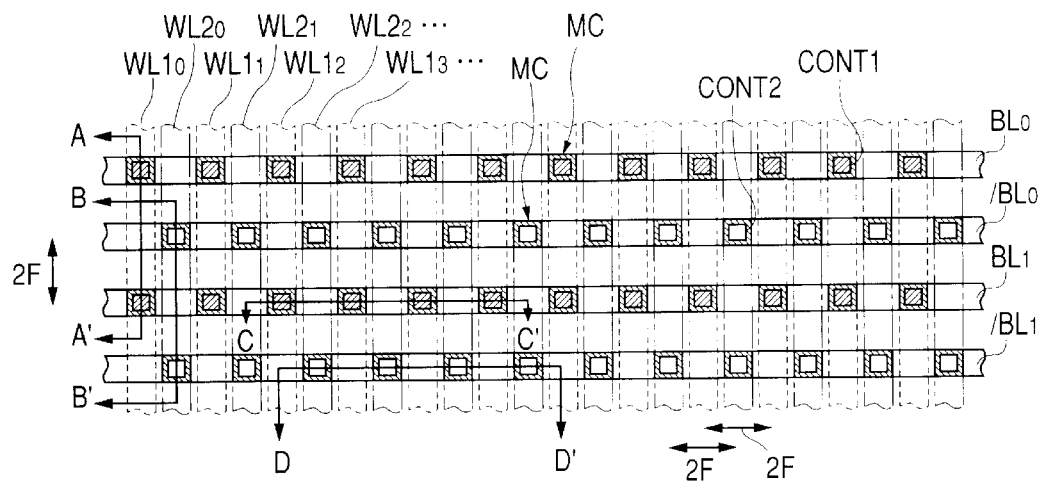
FIG. 3 is an example of an enlarged plan view of a part of memory array of the first embodiment.

FIG. 3 shows an example of an enlarged plan view of a part of the memory array formed of the intersection cells as many as $4F^2$-2 as the embodiment 1.

The first word lines WL1s (WL1$_0$, WL1$_1$, WL1$_2$, WL1$_3$, . . . ) are formed of a first layer wiring, the second word lines WL2s (WL2$_0$, WL2$_1$, WL2$_2$, . . . ) are formed of a second layer wiring, and the second word lines WL2s are formed on the area between the adjacent first word lines WL1s sandwiching an insulation film. When the minimum design size is defined as F, the first word lines WL1s and second word lines WL2s are respectively arranged in parallel in the row direction with the pitch of 2F, and the first word lines WL1s and second word lines WL2s are alternately arranged in the pitch of ½ in the horizontal direction, namely with the interval of F.

The first bit lines BLs (BL$_0$, BL$_1$) and the second bit lines /BLs (/BL$_0$, /BL$_1$) forming the bit-line pair are formed of the conductive film of the same layer and are arranged in parallel in the column direction with the pitch of 2F.

A MISFET for selecting memory cells (indicated as the hatched areas in the figure) arranged at the intersections of the first word lines WL1s and one of the bit-line pair (intersections of the first word lines WL1s and the first bit lines BLs in the figure) and at the intersections of the second word lines WL2s and the other of the bit-line pair (intersections of the second word lines WL2s and the second bit lines /BLs in the figure) forms in the vertical full depletion type construction in which a substrate having formed the channel region in the vertical direction is provided on the main surface of the semiconductor substrate. As will be explained later, in this vertical full depletion type MISFET, the first bit lines BLs or the second bit lines /BLs are provided at the upper side of the substrate in which the channel region is formed and the capacitor is provided in the lower side thereof. Moreover, gate electrodes are respectively provided covering the substrate to form the channel region, the substrate to form the first bit lines BLs and the channel region and the second bit lines /BLs, and these gate electrodes are connected to the first word lines WL1s or the second word lines WL2s via the connecting portion. In the figure, a black square indicates a connecting portion CONT1 of the first word lines WL1s and the gate electrode of selection MISFET, while a white square indicates the connecting portion CONT2 of the second word lines WL2s and the gate electrode of selection MISFET.

Figure 4:
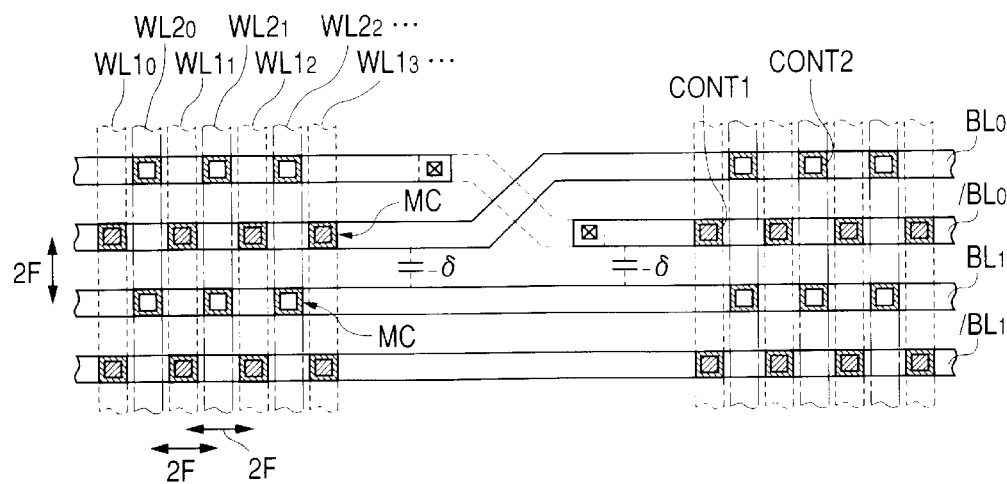
FIG. 4 is another example of an enlarged plan view of a part of memory array of the first embodiment.

FIG. 4 shows another example of an enlarged plan view of a part of a memory array formed of the intersection cells as many as $4F^2$–2 as the embodiment 1 wherein the first bit line BL$_0$ and the second bit line /BL$_0$ shown in FIG. 3 are formed crossing with each other in the single multi-level crossing method.

When an interval of the bit-line pair becomes narrow and a coupling capacitance between the bit lines increases, a problem that an interference noise increases will be generated but an interference noise can be reduced by providing the first bit line BL$_0$ and the second bit line /BL$_0$ to cross with each other. For example, since noise −δ which is equal to the first bit line BL$_0$ and second bit line /BL$_0$ is generated in the same layer from the adjacent first bit line BL$_1$, when it is possible to neglect a delay time on the first bit line BL$_0$ and second bit line /BL$_0$, noise can be cancelled with an output of the sense amplifier.

Figure 5:
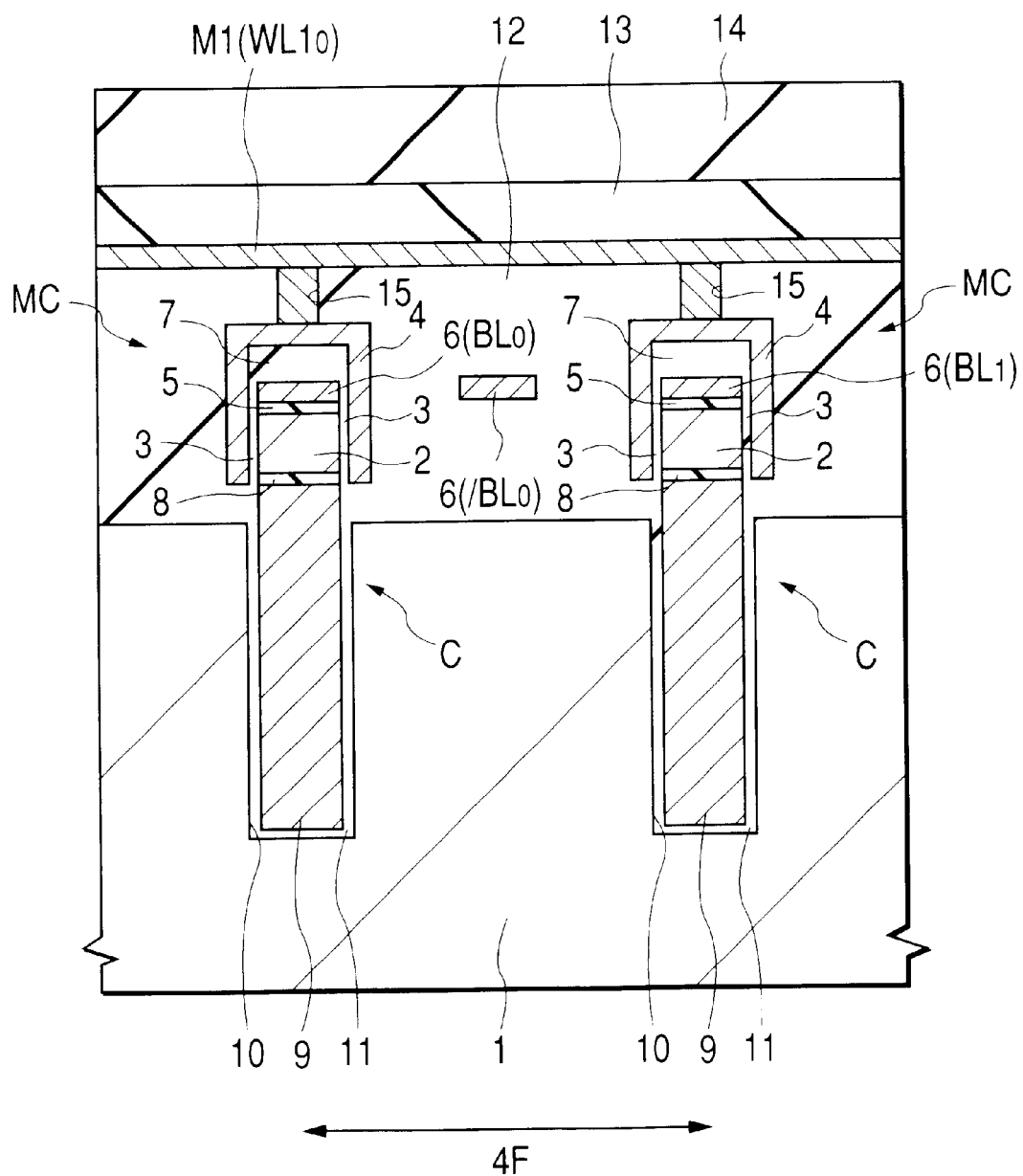
FIG. 5 is a cross-sectional view of the essential portion of a semiconductor substrate showing a construction of a memory cell along the line A–A' of FIG. 3.
Figure 6:
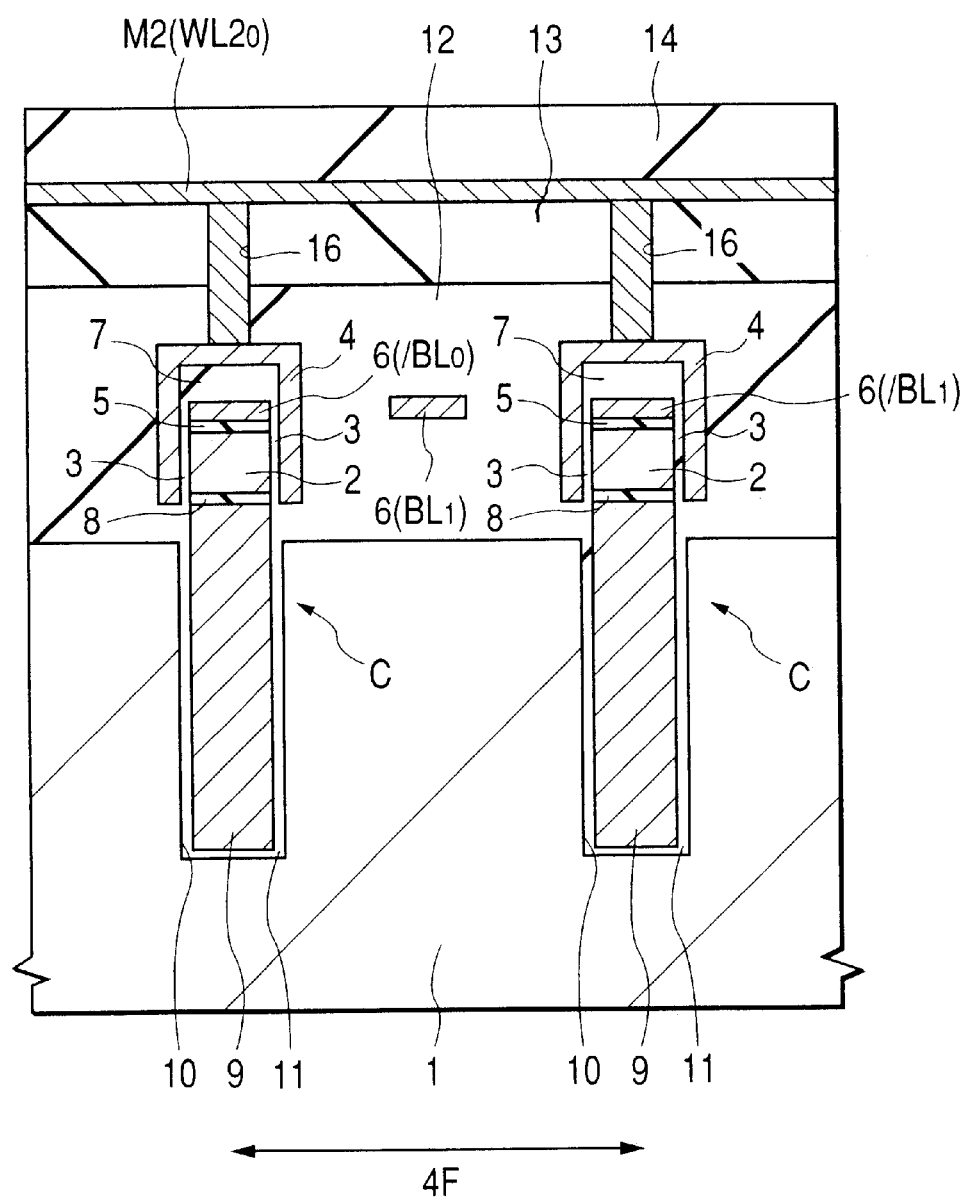
FIG. 6 is a cross-sectional view of the essential portion of a semiconductor substrate showing a construction of a memory cell along the line B–B' of FIG. 3.
Figure 7:
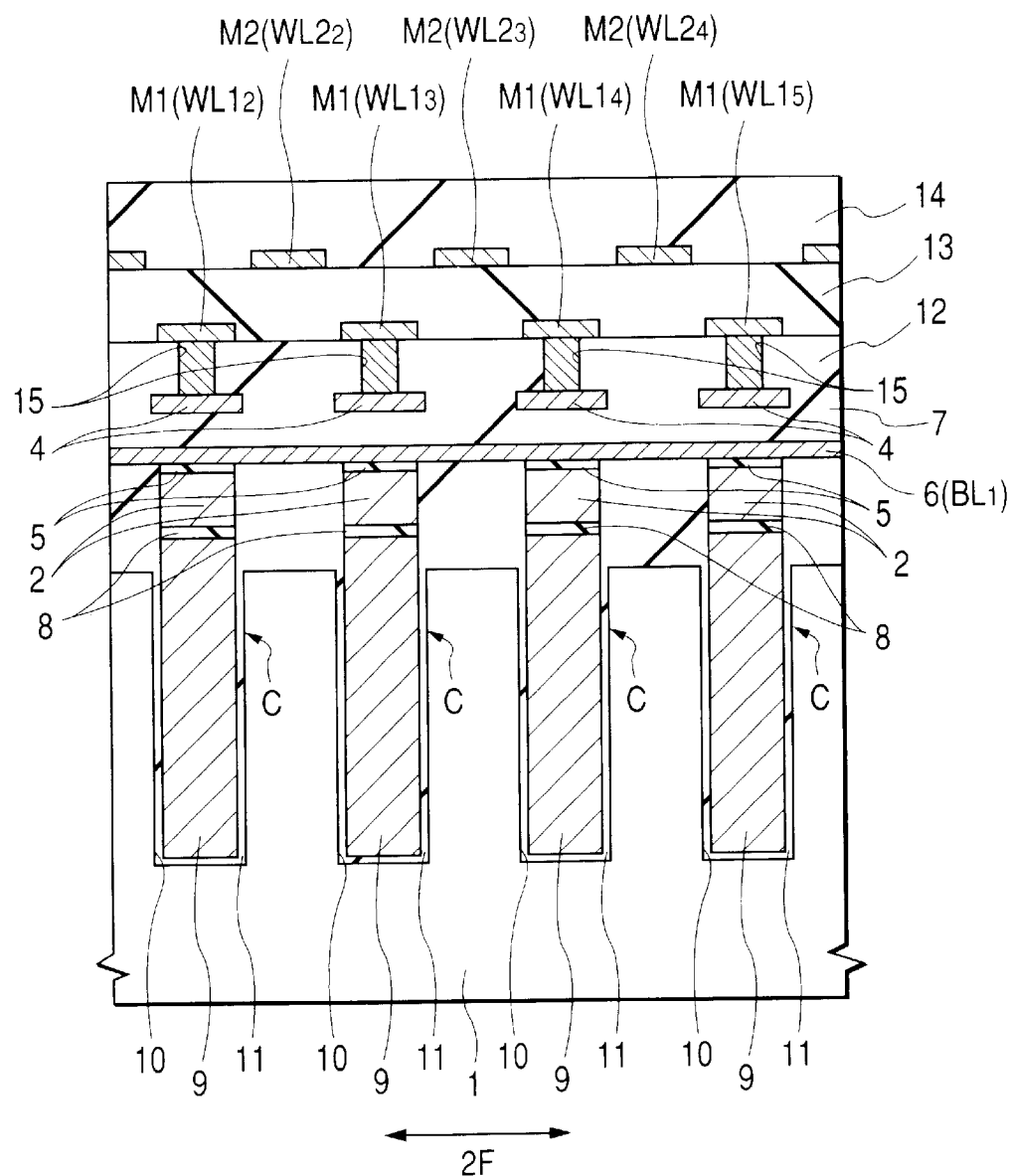
FIG. 7 is a cross-sectional view of the essential portion of a semiconductor substrate showing a construction of a memory cell along the line C–C' of FIG. 3.
Figure 8:
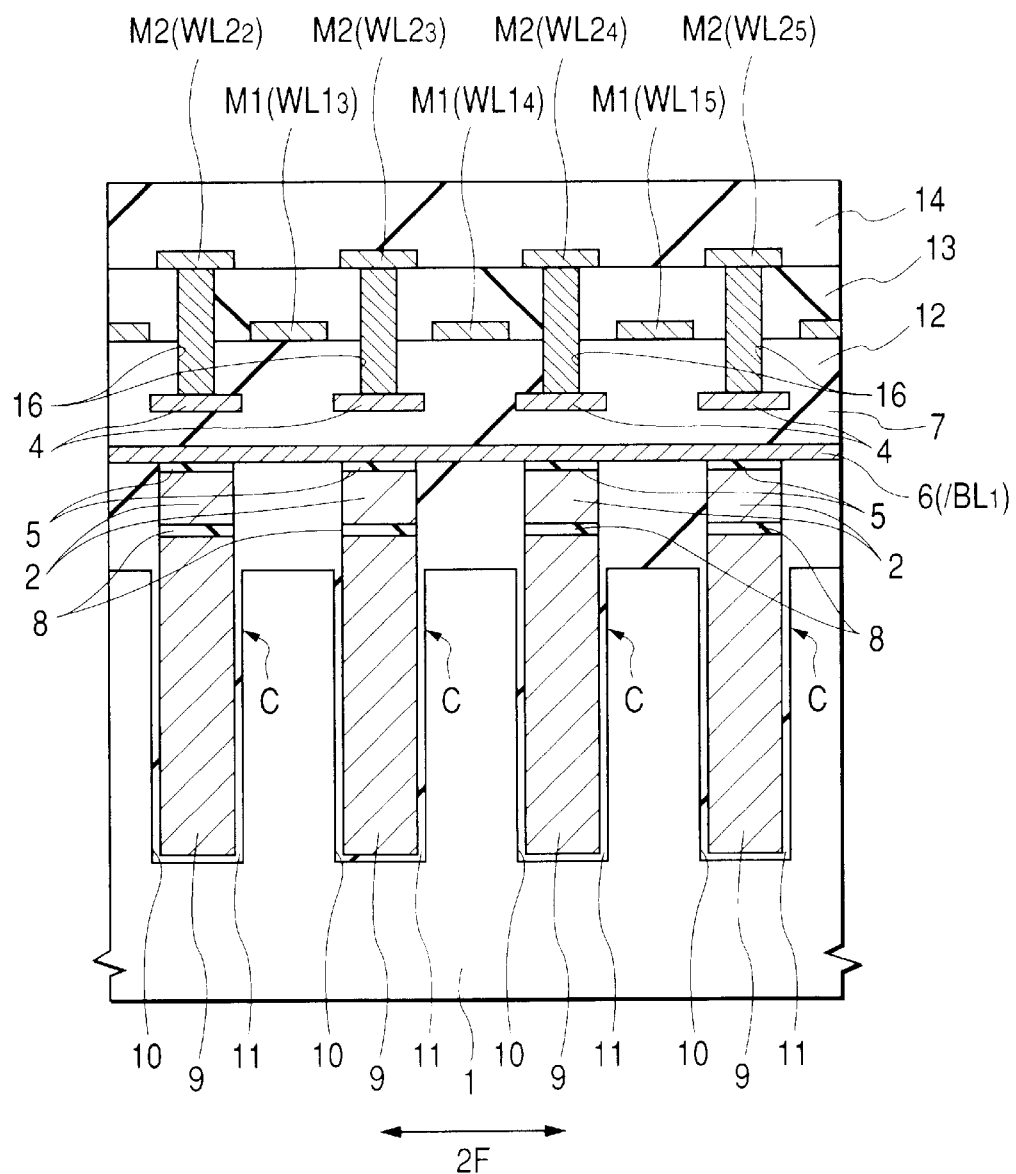
FIG. 8 is a cross-sectional view of the essential portion of a semiconductor substrate showing a construction of a memory cell along the line D–D' of FIG. 3.

Next, an example of a construction of the memory cell as the embodiment 1 will be explained with reference to the cross-sectional view of the essential portion of a semiconductor substrate shown in FIG. 5 to FIG. 8. FIG. 5 is a cross-sectional view of the essential portion of a semiconductor substrate along the line A–A' of FIG. 3. FIG. 6 is a cross-sectional view of the essential portion of a semiconductor substrate along the line B–B' of FIG. 3. FIG. 7 is a cross-sectional view of the essential portion along the line C–C' of FIG. 3. FIG. 8 is a cross-sectional view of the essential portion along the line D–D' of FIG. 3.

A gate electrode 4 is arranged, via the gate insulation film 3 in the thickness of about 10 nm, in both sides of the row direction of a polysilicon film 2 arranged vertically on the main surface of the semiconductor substrate 1, and the gate electrode 4 formed of polysilicon films in both sides is integrally formed and is always set to the equal potential. The polysilicon film 2 is an intrinsic polysilicon in which an n-type impurity, for example, phosphorus (P) is introduced in a very lower concentration, for example, as low as about $10^{15}$ to $10^{17}$ cm$^{-3}$, and forms a substrate which is used as the channel region of the selection MISFET.

A polysilicon film 6 is formed on the upper side of the polysilicon film 2 via a barrier film (first barrier film) 5 formed of a silicon nitride film in the thickness of about 2 to 3 nm. An n-type impurity, for example, phosphorus is introduced into the polysilicon film 6 in the concentration, for example, of about $10^{20}$ cm$^{-3}$ and the polysilicon film 6 is extended in the column direction to work as the first bit line BL or the second bit line /BL. Moreover, a polysilicon film of the same layer as the gate electrode 4 is arranged on the upper layer of the polysilicon film 6 via an insulation film 7 in the thickness of about 100 nm. Therefore, the first bit line BL and the second bit line /BL formed of the polysilicon film 6 are shielded at both side surfaces in the row direction and the upper surface thereof with a polysilicon film, a part of which functions as the gate electrode 4, and thereby an interference noise among the bit lines can be reduced.

In addition, at the lower side of the polysilicon film 2, a polysilicon film 9 is formed via a barrier film (second barrier film) consisting of a silicon nitride film in the thickness of about 2 to 3 nm. This polysilicon film 9 is embedded into a groove 10 formed on the semiconductor substrate 1 via an insulation film 11 and forms an accumulation node of the capacitor C.

The barriers 5, 8 function as the stoppers, in the manufacturing process, which prevent relative diffusion of an n-type impurity to the polysilicon film 2 of low concentration from the polysilicon films 6, 9 of high concentration.

At the upper layer of the selection MISFET, a first interlayer insulation film 12 is formed and a first word line WL1 is arranged in orthogonal to the bit-line pair on the first interlayer insulation film 12. The first word line WL1 is formed of the first layer wiring M1 consisting of a metal film such as aluminum (Al). Moreover, a second interlayer insulation film 13 is formed on the first word line WL1 and a second word line WL2 is arranged orthogonal to the bit-line pair on the second interlayer insulation film 13. The second word line WL2 is formed, for example, of a second layer wiring M2 consisting of a metal film such as aluminum. The second layer wiring M2 is covered with a third layer insulation film 14 and moreover a wiring layer of further upper layer which is required for circuit operation is also provided, although it is not illustrated in the figure.

The second word line WL2 is arranged above the area between the adjacent first word lines WL1s, and the first word line WL1 and the second word line WL2 are alternately running in the row direction in separation to the upper and lower layers. Moreover, a plurality of word lines WL1s are arranged in the same pitch in the row direction and a plurality of the second word lines WL2s are also arranged in the same pitch in the row direction in the same manner. When the minimum design size is defined as F, the pitch can be set to 2F for both first word line WL1 and second word line WL2.

The gate electrode 4 of the selection MISFET is connected to the first word line WL1 or the second word line WL2, the gate electrode 4 connected to the first word line WL1 is then connected to the first word line WL1 through a contact hole 15 (the part corresponding to the connecting portion CONT1 of FIG. 3) formed to the first interlayer insulation film 12, the gate electrode 4 connected to the second word line WL2 is connected to the second word line WL 2 through a contact hole 16 (the part corresponding to the connecting portion CONT2 of FIG. 3) formed to the first interlayer insulation film 12 and second interlayer insulation film 13.

A plurality of first bit lines BLs and a plurality of second bit lines /BLs are extended alternately in the equal pitch in the column direction, and when the minimum design size is defined as F, the pitch of the bit-line pair becomes 4F. Moreover, as explained above, the memory cells MCs are connected to the intersections of a single line of the bit-line pair (the first bit lines BLs in the figure) and the first word lines WL1s crossing orthogonal to such single line and the gate electrodes 4 of the selection MISFETs of a plurality of memory cells MCs connected to a single line of the bit-line pair are all connected to the first word lines WL1s arranged orthogonal to such single line. In the same manner, the memory cells MCs are connected to the intersections of the other line of the bit-line pair (the second bit lines /BLs of the figure) and the second word lines WL2s crossing orthogonal to the other line, and the gate electrodes 4 of the selection MISFETs of a plurality of memory cells MCs connected to the other line of the bit-line pair are all connected to the second word lines WL2s arranged orthogonal to the other line. However, when the bit lines are crossed with each other, the gate electrodes of the selection MISFETs of the memory cells MCs connected to one line of the bit-line pair are changed in connection, as shown in FIG. 4, through the cross wiring to the second word lines WL2s from the first word lines WL1s or to the first word lines WL1s from the second word lines WL2s.

Next, the other examples of the construction of memory cells of the embodiment 1 are shown in FIG. 9 to FIG. 13. These figures are cross-sectional views of the essential portion of the semiconductor substrate along the line A–A' of FIG. 3.

Figure 9:
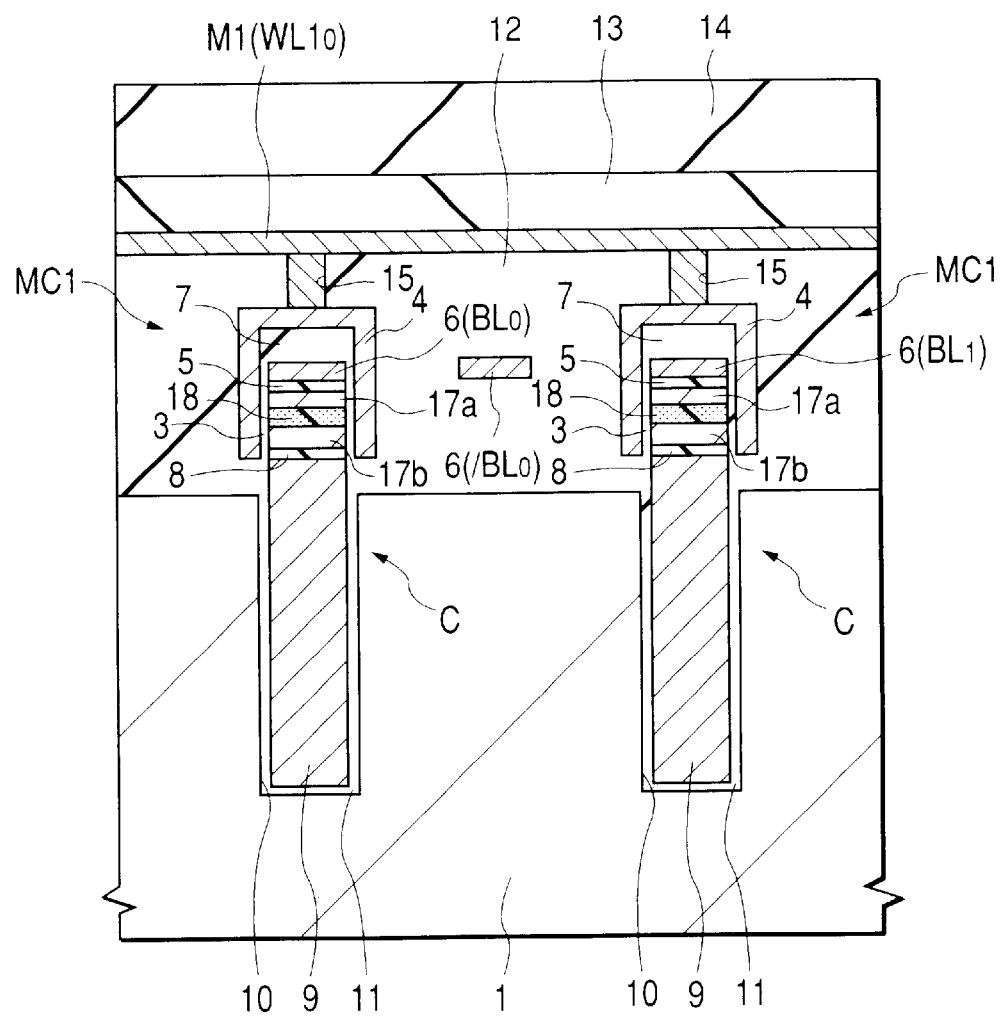
FIG. 9 is a cross-sectional view of the essential portion of a semiconductor substrate showing another example of construction of a memory cell.

FIG. 9 shows a memory cell MC1 wherein the substrate on which the channel region of the selection memory cell shown in FIG. 5 is formed is constructed by laminated two layers of the polysilicon films 17a, 17b. A central tunnel film 18 consisting of a silicon nitride film in the thickness of about 2 to 3 nm is formed between the upper polysilicon film 17a and the lower polysilicon film 17b. This central tunnel film 18 is provided to control an off-current of the selection MISFET to a low level and has a function to work as a stopper which prevents the holes or electrons generated by the polysilicon films 17a, 17b in the off condition to flow across the bit-line and accumulation node as a current. Moreover, since the central tunnel film 18 is provided, the a-ray soft-error resistance characteristic or cosmic-ray soft-error resistance characteristic can be improved. However, since an on-current is also reduced by providing the central tunnel film 18, it is preferable to set the thickness of the central tunnel film 18 to about 2 to 3 nm.

Figure 10:
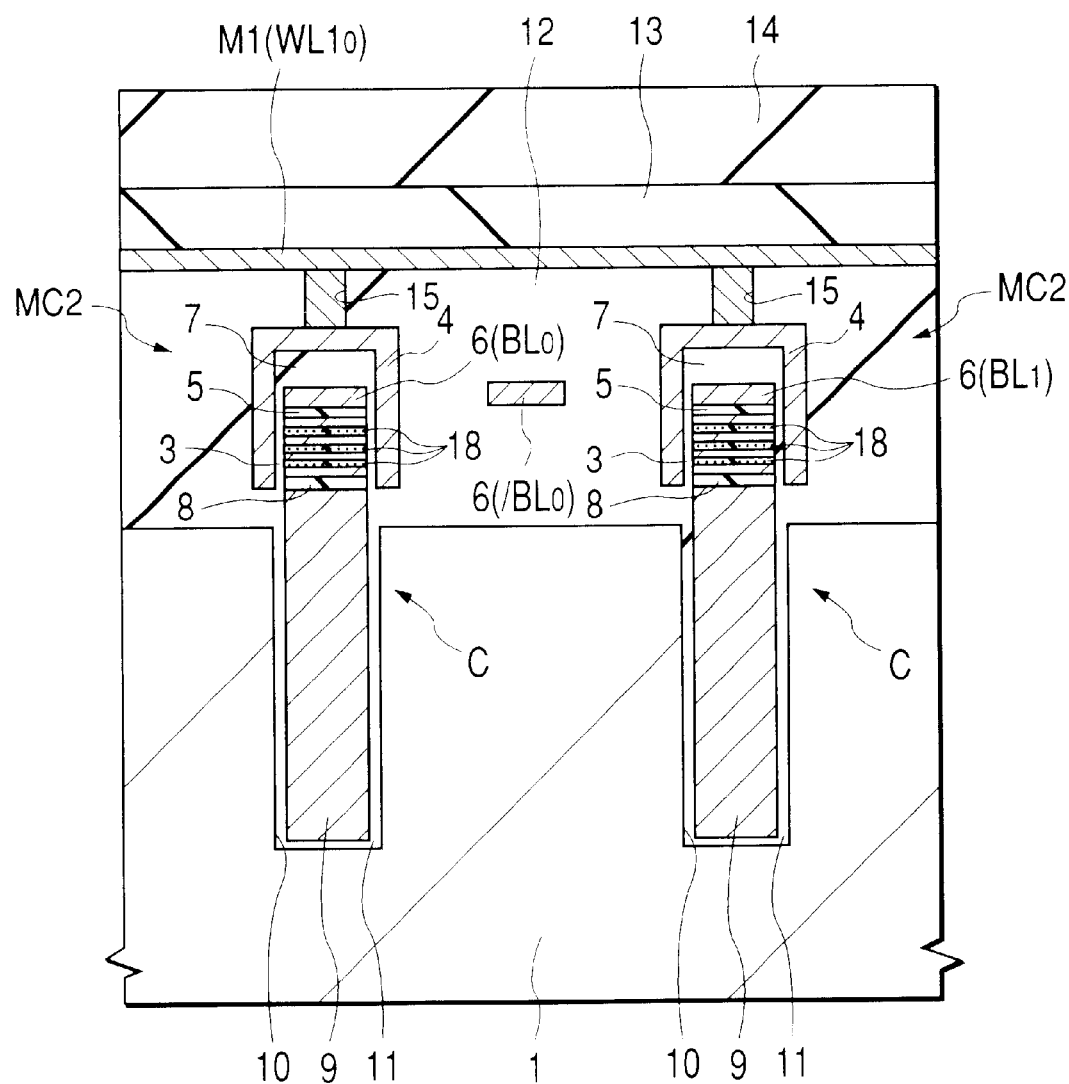
FIG. 10 is a cross-sectional view of the essential portion of a semiconductor substrate showing the other example of construction of a memory cell.

FIG. 10 shows a memory cell MC2 consisting of the selection memory cell in which the central tunnel layer 18 is formed as a multilayer film. In this figure, the central tunnel layer is formed in the three-layer construction. The suppression effect of the off-current can be enhanced by forming the central tunnel layer 18 in a multilayer film construction.

Figure 11:
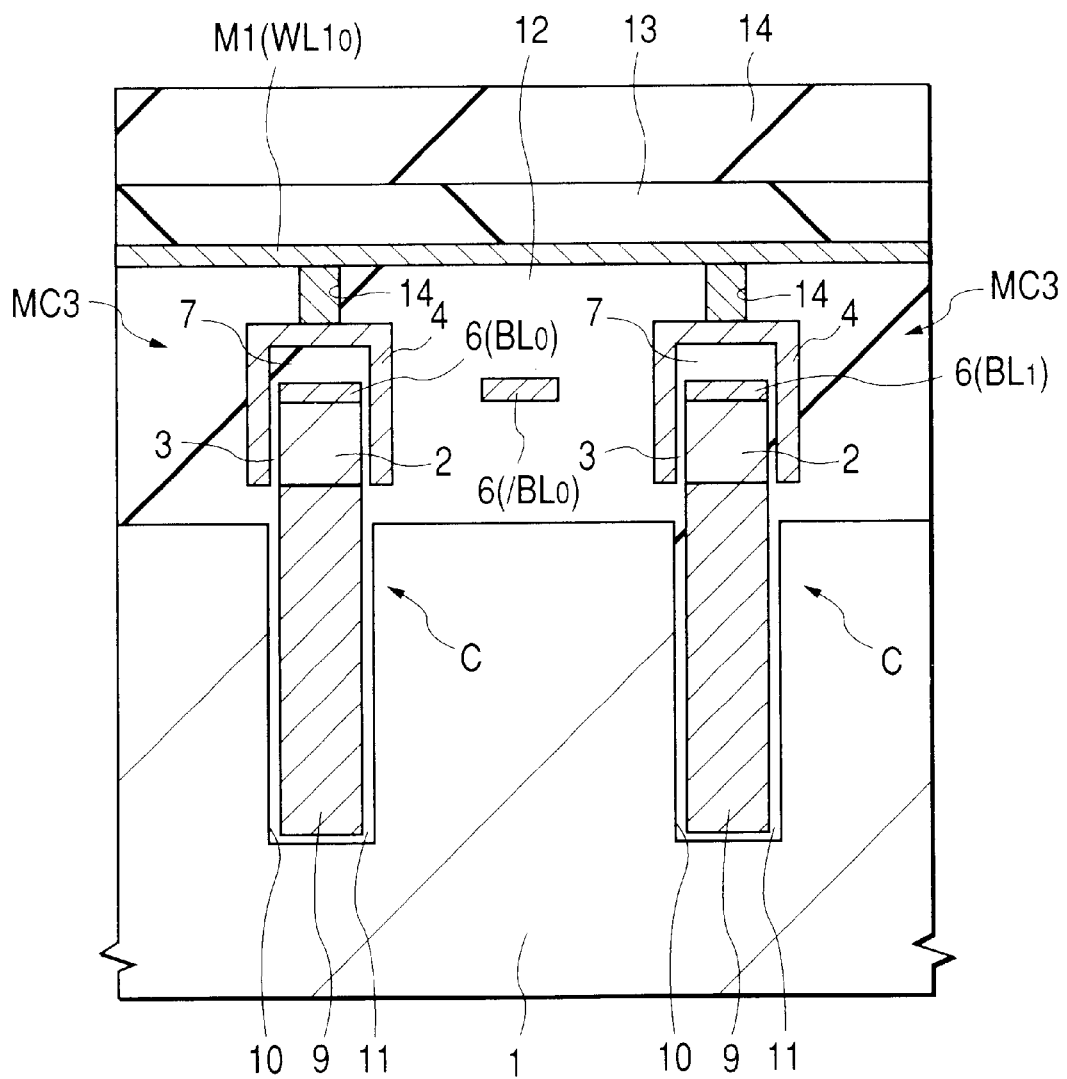
FIG. 11 is a cross-sectional view of the essential portion of a semiconductor substrate showing the other example of construction of a memory cell.

FIG. 11 shows a memory cell MC3 in which the first bit line BL or second bit line /BL is formed in direct at the upper side of the substrate where the channel region of the selection memory cell is formed and the accumulation node of the capacitor C is formed in direct at the lower side thereof. For example, when it is possible to prevent diffusion of an n-type impurity to a substrate on which a channel region is formed from a polysilicon film 6 forming the first bit line BL or second bit line /BL or from a polysilicon film 9 forming the accumulation node of the capacitor C by introducing the low-temperature process in the manufacturing process, the barrier films provided at the upper and lower surfaces of the substrate on which the channel region is formed can be deleted.

Figure 12:
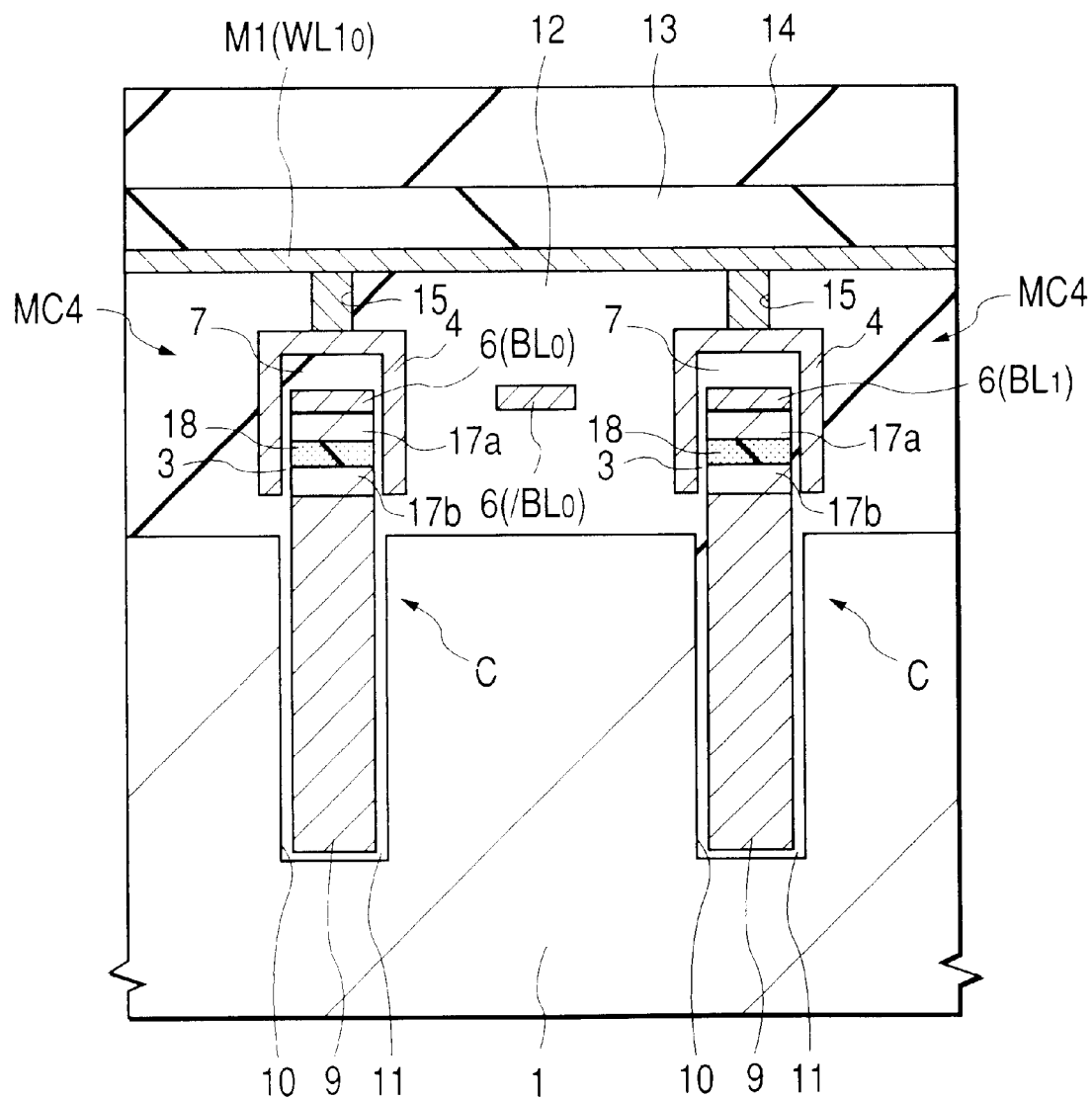
FIG. 12 is a cross-sectional view of the essential portion of a semiconductor substrate showing the other example of construction of a memory cell.
Figure 13:
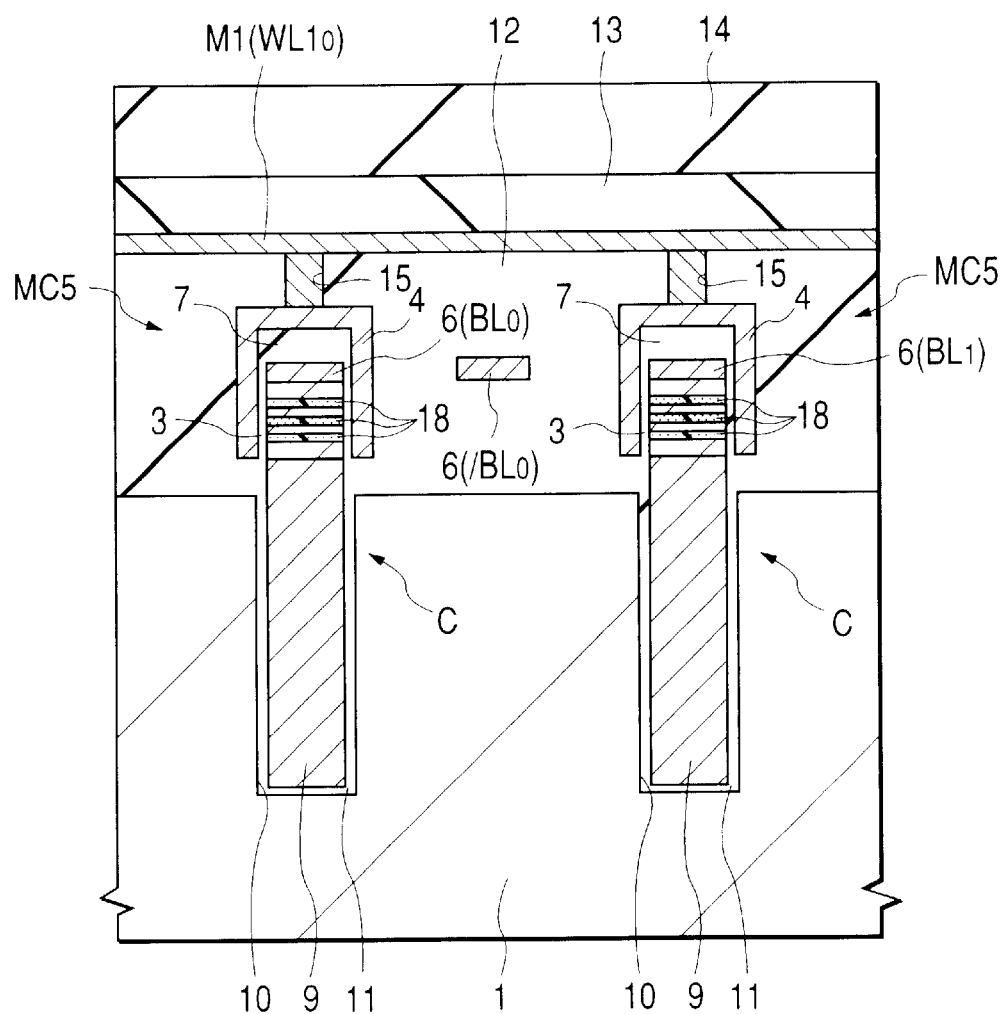
FIG. 13 is a cross-sectional view of the essential portion of a semiconductor substrate showing the other example of construction of a memory cell.

FIG. 12 shows a memory cell MC4 in which a barrier layer is not used but a single layer of central tunnel layer 18 is provided on the substrate where the channel region of the selection MISFET is formed, while FIG. 13 shows a memory cell MC5 in which a barrier layer is not used but a central tunnel film 18 of three-layer construction is provided on the substrate where the channel region of the selection MISFET is formed. In both memory cells MC4 and MC5, an off-current can be reduced by providing the central tunnel film 18.

As explained above, according to the embodiment 1 of the present invention, the memory cells MCs can be arranged to all intersections of the first word line WL1 and a line of the bit-line pair and to all intersections of the second word line WL2 and the other line of the bit-line pair by forming the first word line WL1 with a first layer wiring M1, forming the second word line WL2 with a second layer wiring M2, arranging the first word line WL1 and the second word line WL2 in parallel in the row direction with the identical pitch and alternately arranging the first word line WL1 and the second word line WL2 with the interval equal to a half of the pitch in the horizontal direction. Thereby, when the minimum design size is defined as F in the fold-back bit-line arrangement, the cell area can be set to $4F^2$ which is identical to that of the open bit-line arrangement and accordingly high density arrangement of memory cells can be realized. In addition, interference noise generated from the bit lines and appearing on the memory cells MCs can be lowered by forming the selection MISFET of memory cell in the vertical full depletion type construction and shielding the substrate where the channel region is formed and the first bit line BL formed on this substrate and the substrate where the channel region is formed and the second bit line /BL formed on this substrate with the polysilicon film, a part of which forms the gate electrode 4 of the selection MISFET.

(Embodiment 2)

Figure 14:
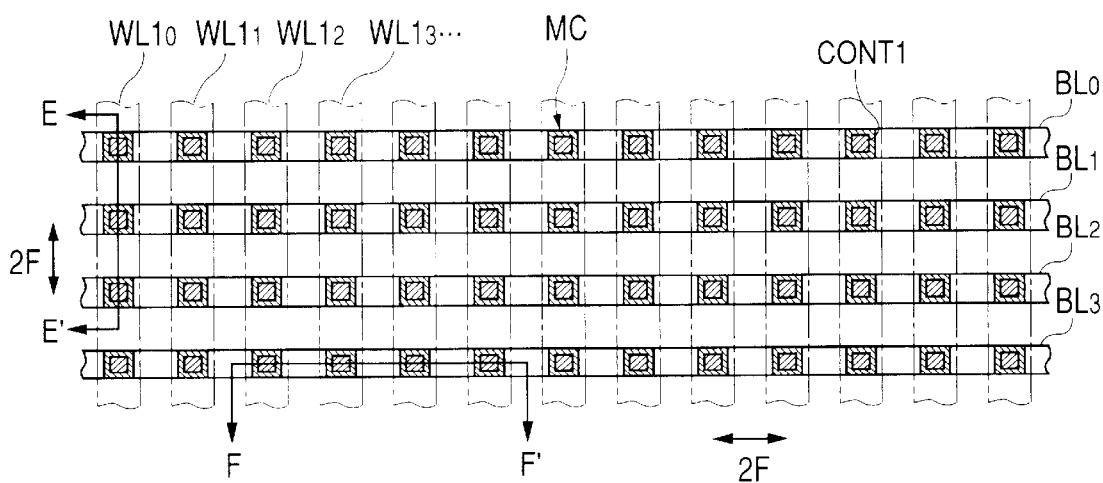
FIG. 14 is an example of an enlarged plan view of a part of memory cell as a second embodiment.

FIG. 14 shows an example of an enlarged plan view of a part of the memory array formed of the intersection cells as many as $4F^2$-1 of the embodiment 2 of the present invention.

The word line (first word line WL1) is arranged in the row direction for the memory cells and the bit-line pair (first bit line BL and second bit line /BL) are arranged in the column direction. Thereby, an open bit-line arrangement is formed in which the first bit line BL and the second bit line /BL are respectively divided into two sections sandwiching the sense amplifiers to form the pair-lines. Since the first bit line BL and the second bit line /BL are symmetrical sandwiching the sense amplifiers, FIG. 14 shows only the memory array in which the first bit line BL is arranged. The memory array where the second bit line /BL is arranged is not illustrated and not explained here.

The first word lines WL1s (WL1$_0$, WL1$_1$, WL1$_2$, WL1$_3$, . . . ) are formed of the first layer wiring and these first word lines WL1s are arranged, when the minimum design size is defined as F, in parallel in the row direction with the pitch of 2F. Moreover, the first bit lines BLs forming a bit-line pair (BL$_0$, BL$_1$, BL$_2$, BL$_3$) are arranged in parallel in the column direction with the pitch of 2F. Namely, in the open bit-line arrangement, the memory cells are arranged to all intersections where the first word line WL and the first bit line BL are crossing in orthogonal and when the minimum design size is defined as F, for example, the intersection cells as many as $4F^2$-1 of the cell area of $4F^2$ can be realized.

The selection MISFETs of the memory cells (hatched areas in the figure) MCs arranged to the intersections of the first word line WL1 and the first bit line BL have the construction almost similar to that explained in the embodiment 1 and are formed in the vertical full depletion type construction in which a semiconductor substrate forming the channel region in the vertical direction on the main surface thereof is provided. In the FIG. 14, the black squares shows the connecting portions CONT1 of the first word line WL1 and the gate electrode selection MISFET.

Figure 15:
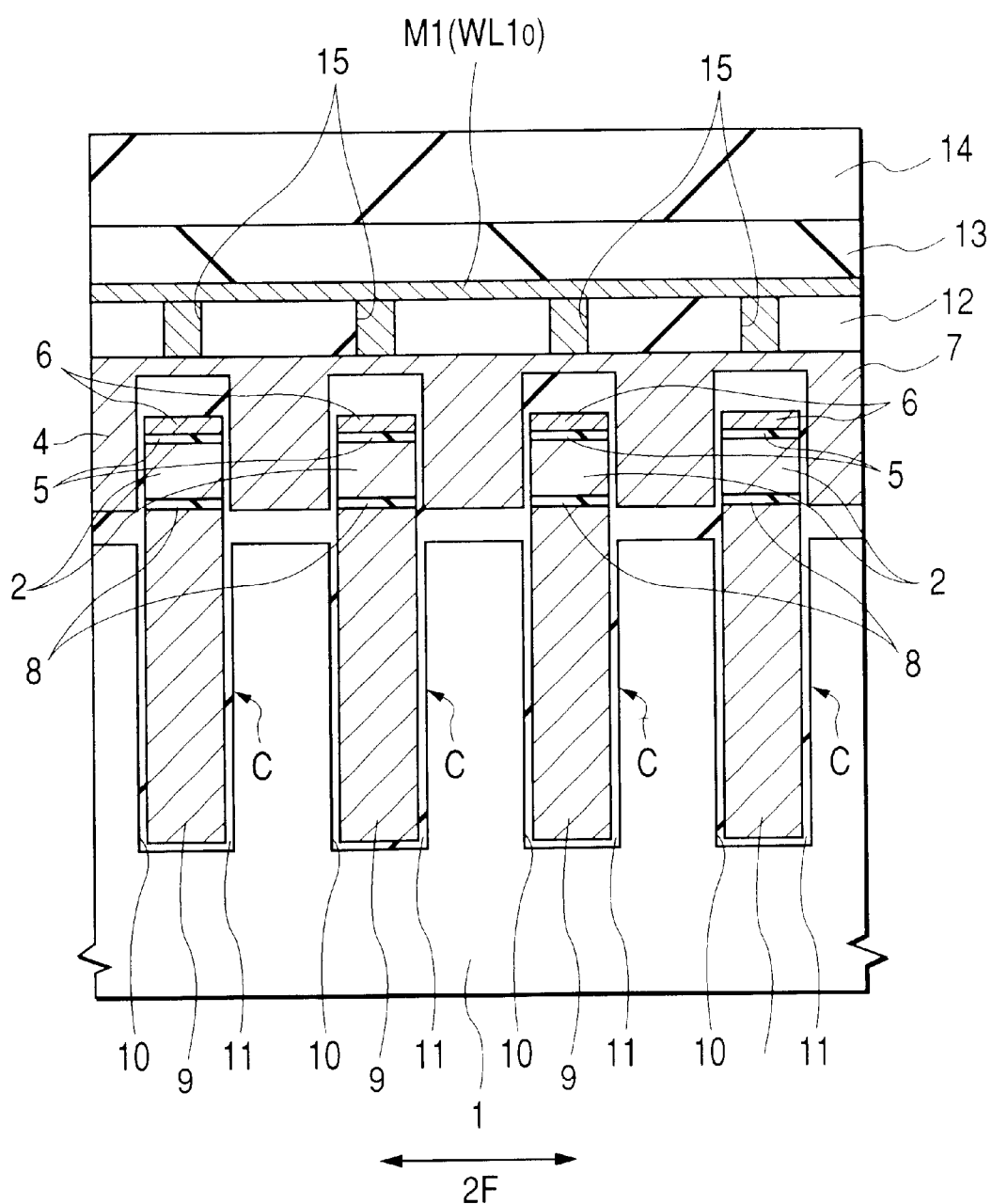
FIG. 15 is a cross-sectional view of the essential portion of a semiconductor substrate showing a construction of a memory cell along the line E–E' of FIG. 14.
Figure 16:
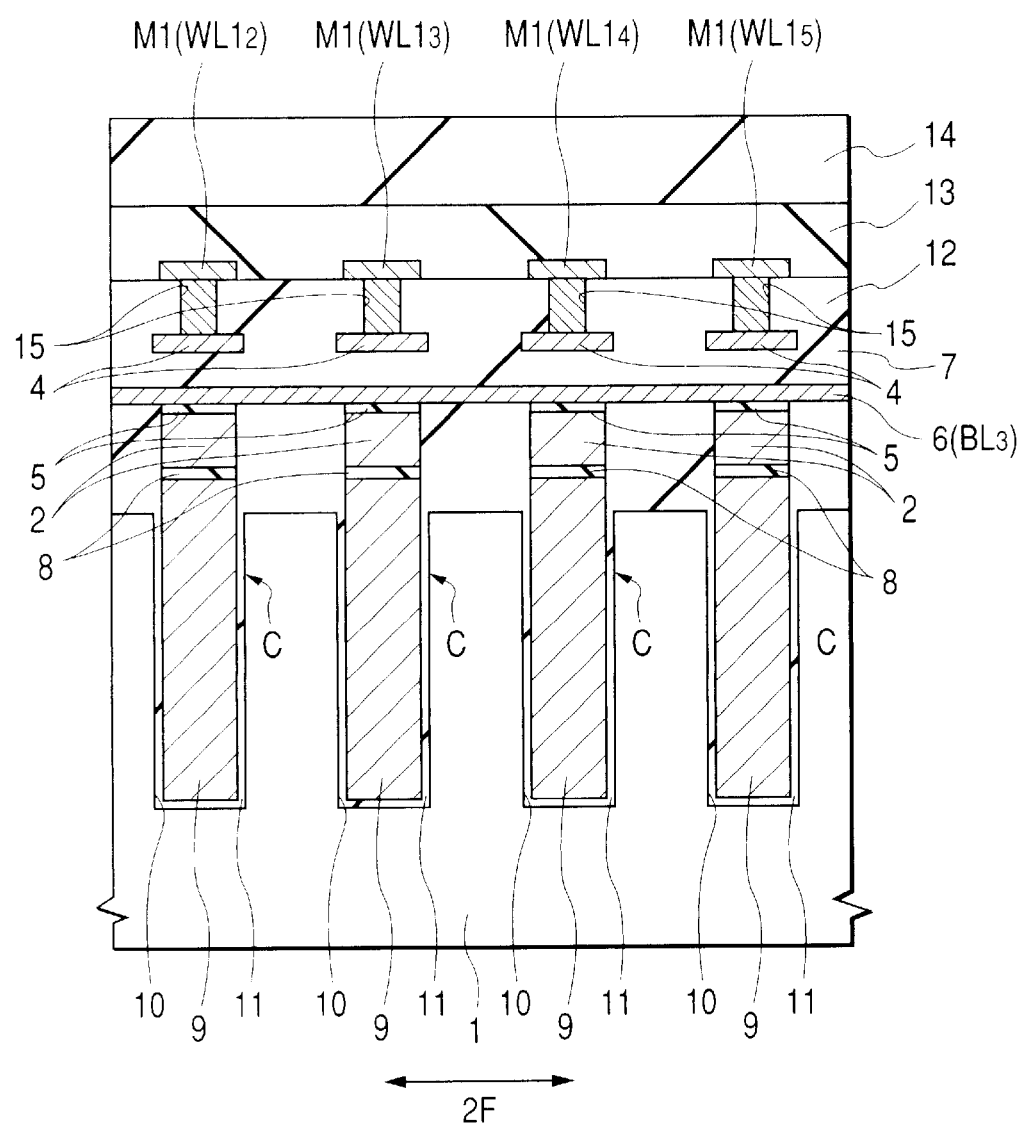
FIG. 16 is a cross-sectional view of the essential portion of a semiconductor substrate showing a construction of a memory cell along the line F–F' of FIG. 14.
Figure 17:
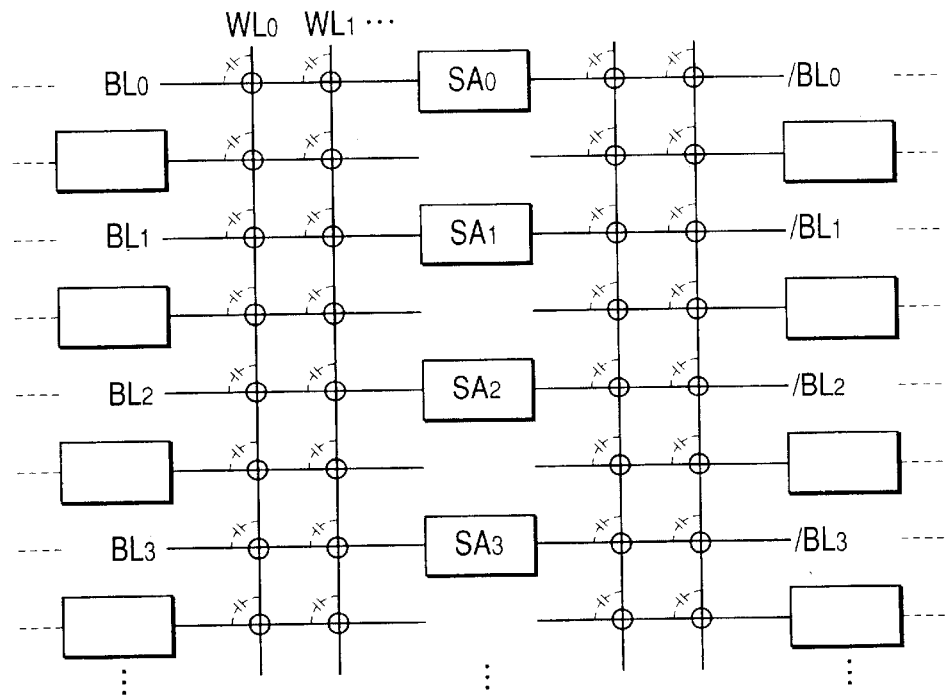
FIG. 17 is a diagram showing the open bit-line arrangement investigated by the inventors of the present invention.
Figure 18:
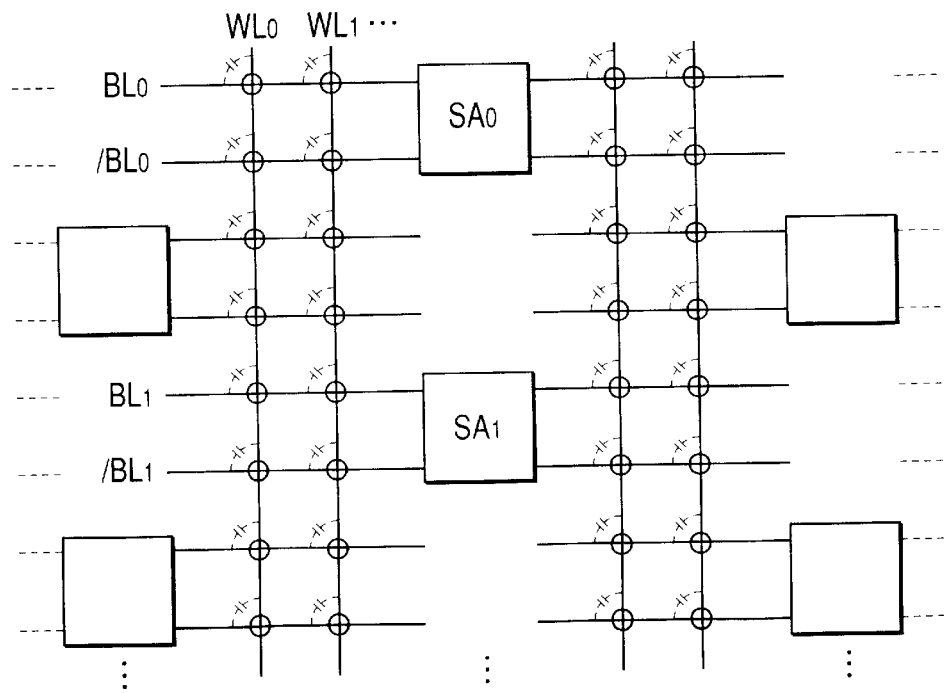
FIG. 18 is a diagram showing the fold-back bit-line arrangement investigated by the inventors of the present invention.

Next, an example of the memory cell construction as the embodiment 2 will be explained with reference to the cross-sectional view of the essential portion of the semiconductor substrate shown in FIG. 15 and FIG. 16. FIG. 15 shows the cross-sectional view of the essential portion of the semiconductor substrate along the line E–E' of FIG. 14. FIG. 16 shows the cross-sectional view of the essential portion of the semiconductor substrate along the line F–F' of FIG. 14.

A gate electrode 4 is arranged in both sides of the row direction of a polysilicon film 2 arranged vertically on the main surface of the semiconductor substrate 1 via a gate insulation film 3 in the thickness of about 10 nm. This gate electrode 4 is formed of the polysilicon film which is provided in common for the memory cells MCs arranged in the row direction and is always set to the identical potential. The polysilicon film 2 forms the substrate working as the channel region of the selection MISFET.

On the upper side of the polysilicon film 2, a polysilicon film 6 is formed via a barrier film 5 consisting of a silicon nitride film whose thickness is about 2 to 3 nm. The polysilicon film 6 is extended in the column direction and works as the first bit line BL or the second bit line /BL. Moreover, on the upper layer of the polysilicon film 6, a polysilicon film of the same layer as the gate electrode 4 is arranged via an insulation film 7 with the thickness of about 100 nm. Therefore, the first bit line BL and the second bit line /BL formed of the polysilicon film 6 are shielded at its both side surfaces in the row direction and the upper surface thereof with the polysilicon film, a part of which functions as the gate electrode 4. Thereby, interference noise among the bit lines can be lowered.

Moreover, a polysilicon film 9 is formed at the lower side of the polysilicon film 2 via a barrier 8 consisting of a silicon nitride film in the thickness of about 2 to 3 nm. This polysilicon film 9 is embedded via an insulation film 11 within a groove 10 formed on the semiconductor substrate 1 and forms the accumulation node of the capacitor C.

At the upper layer of the selection MISFET, a first interlayer insulation film 12 is formed and the first word line WL1 is arranged orthogonal to the bit line pair on this first layer insulation film 12. The first word line WL1 is formed, for example, of a first layer wiring M1 consisting of a metal film, for example, of aluminum. The gate electrode 4 of the selection MISFET is connected to the first word line WL1 and the gate electrode 4 connected to the first word line WL1 is connected to the first word line WL1 via a contact hole 15 (part corresponding to the connection portion CONT1 of FIG. 14) formed to the first interlayer insulation film 12.

As explained above, the memory cells MCs are connected to the intersections of one line of the bit-line pair (first bit line BL in the figure) and the first word line WL1 crossing orthogonal to above one line and the gate electrodes 4 of the selection MISFETs of a plurality of memory cells MCs connected to one line of the bit-line pair are all connected to the first word line WL1 arranged orthogonal thereto.

As explained above, according to the embodiment 2 of the present invention, interference noise which is generated from the bit lines and appearing on the memory cells MCs can be lowered even in the open bit-line arrangement by forming the selection MISFET of memory cell in the vertical full depletion type construction and then shielding the substrate where the channel region is formed and the first bit line BL formed on the substrate, the substrate where the channel region is formed and the second bit line /BL formed on the substrate with the polysilicon film, a part of which forms the gate electrode 4 of the selection MISFET. Moreover, since the word line can be formed of a single layer wiring, the manufacturing process of memory array can be reduced in comparison with that of the embodiment 1.

The present invention has been explained on the basis of the preferred embodiments but the present invention is not limited thereto and may be changed and modified within the scope of the claims.

The present invention disclosed in this specification can provide the effects explained hereunder.

The DRAM of the fold-back type bit line arrangement providing the cell area of $4F^2$ can be realized by arranging the memory cells to all intersections of the word line consisting of the first wiring and a single line of bit-line pair and all intersections of the word line consisting of the second wiring and the other line of the bit-line pair.

Moreover, influence of noise generated from bit lines and appearing on the memory cells can be lowered by forming the selection MISFET of memory cell in the vertical type construction and shielding the bit line located on the substrate where the channel region is formed with a conductive film, a part of which forms the gate electrode.

What is claimed is:

1. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with an equal pitch, and said first word line and said second word line are alternately arranged at a constant interval in the horizontal distance.

2. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with an equal pitch, and said first word line and said second word line are alternately arranged at a constant interval in a horizontal distance, and wherein memory cells are arranged to the intersections of said first word line and one line of said bit-line pair and the intersection of said second word line and the other line of said bit-line pair.

3. A semiconductor storage device according to claim 1 or 2, wherein one end of said first word line and one end of said second word line arranged over one cell array are respectively connected with word drivers.

4. A semiconductor storage device according to claim 2, wherein when a minimum design size is defined as F, the cell area of said memory cell is expressed as 4F2.

5. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with the equal pitch, and said first word line and said second word line are alternately arranged at a constant interval in the horizontal distance, wherein said memory cells are arranged to the intersections of said first word line and one line of said bit-line pair and the intersection of said second word line and the other line of said bit-line pair, and wherein said memory cell is comprised of: a semiconductor substrate over which main surface thereof a channel region is formed; a gate electrode integrally arranged in both sides of said substrate in a row direction via a relatively thinner gate insulation film and is always set to an identical voltage; a bit line connected to an upper side of said substrate and is extending in a column direction to form one line or the other line of said bit-line pair; and an accumulation node of a capacitor connected to a lower side of said substrate and which is provided within a groove formed in said semiconductor substrate, wherein a conductive film of the same layer as said gate electrode is arranged over said bit line via a relatively thick insulation film, and wherein both side surfaces in the row direction of said bit line and the upper surface thereof are shielded with said conductive film.

6. A semiconductor storage device according to claim 5, wherein the gate electrode of the selection MISFET of said memory cell arranged over one line of said bit-line pair is connected to said first word line via a first connecting portion, while the gate electrode of the selection MISFET of said memory cell arranged over the other line of said bit-line pair is connected to said second word line via a second connecting portion.

7. A semiconductor storage device according to claim 5 or 6, wherein said bit line is formed of a polysilicon film, and said first word line and said second word line are formed of a metal film.

8. A semiconductor storage device comprising: a plurality of bit-line pairs of an open arrangement connected to the sense amplifiers; a plurality of word lines arranged in a direction crossing said bit-line pairs; and memory cells arranged at the intersections of said word lines and said bit-line pairs, wherein each said memory cell is comprised of: a semiconductor substrate over which main surface thereof a channel region is formed; a gate electrode integrally arranged in both sides of said substrate in a row direction via a relatively thinner gate insulation film and which is always set to an identical voltage; a bit line connected at an upper side of said substrate and which extends in a column direction to form one line or the other line of said bit-line pair; and an accumulation node of a capacitor connected to a lower side of said substrate and which is provided within a groove formed to said semiconductor substrate, wherein a conductive film of the same layer as said gate electrode is arranged over said bit line via a relatively thick insulation film, and wherein both side surfaces in the row direction of said bit line and the upper surface thereof are shielded with said conductive film.

9. A semiconductor storage device according to claim 8, wherein the gate electrode of selection MISFET of said memory cell arranged over one line or the other line of said bit-line pair is connected to said word line formed of the wiring formed at the upper part of said gate electrode via the connecting portion.

10. A semiconductor storage device according to claim 8 or 9, wherein said bit line is formed of a polysilicon film, and said word line is formed of a metal film.

11. A semiconductor storage device according to claim 5 or 8, wherein a first barrier film is provided between said substrate and said bit line, while a second barrier film is provided between said substrate and said accumulation node.

12. A semiconductor storage device according to claim 11, wherein said first barrier film and the second barrier film are formed of a silicon nitride film.

13. A semiconductor storage device according to claim 5 or 8, wherein the first barrier film is provided between said substrate and said bit line, the second barrier film is provided between said substrate and said accumulation node, and said substrate is formed into laminated construction in which a central tunnel film is formed among a plurality of conductive films.

14. A semiconductor storage device according to claim 13, wherein said central tunnel film is formed of a silicon nitride film.

15. A semiconductor storage device according to claim 13, wherein said first barrier film and the second barrier film are formed of a silicon nitride film.

16. A semiconductor storage device according to claim 5 or 8, wherein said bit line is connected in direct at an upper side of said substrate and said accumulation node is connected in direct at a lower side of said substrate.

17. A semiconductor storage device according to claim 5 or 8, wherein said bit line is connected in direct at an upper side of said substrate, the accumulation node is connected in direct at a lower side of said substrate, and said substrate is formed into laminated construction in which a central tunnel film is formed among a plurality of conductive films.

18. A semiconductor storage device according to claim 17, wherein said central tunnel film is formed of a silicon nitride film.

19. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with an equal pitch, and said first word line and said second word line are alternately arranged at a constant interval in the horizontal distance, and wherein said pitch is twice the minimum design size.

20. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with an equal pitch, and said first word line and said second word line are alternately arranged at a constant interval in a horizontal distance, wherein memory cells are arranged to the intersections of said first word line and one line of said bit-line pair and the intersection of said second word line and the other line of said bit-line pair, and wherein said pitch is twice the minimum design size.

21. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with an equal pitch, and said first word line and said second word line are alternately arranged at a constant interval in the horizontal distance, and wherein said constant interval is set to a half of said pitch.

22. A semiconductor storage device comprising: a plurality of bit line pairs of a fold-back arrangement connected to sense amplifiers; and a plurality of first word lines and a plurality of second word lines arranged in a direction crossing said bit line pairs, wherein said first word line is formed of a first wiring, said second word line is formed of a second wiring of a layer different from said first wiring, said first word line and said second word line are respectively arranged in parallel to each other with an equal pitch, and said first word line and said second word line are alternately arranged at a constant interval in a horizontal distance, wherein memory cells are arranged to the intersections of said first word line and one line of said bit-line pair and the intersection of said second word line and the other line of said bit-line pair, and wherein said constant interval is set to a half of said pitch.

23. A semiconductor storage device comprising:

a plurality of bit lines connected to sense amplifiers; and a plurality of first word lines and a plurality of second word lines arranged in a direction crossing said bit lines;

wherein a first insulating film is formed over a main surface of a semiconductor substrate;

wherein said first word line is formed over said first insulating film, wherein a second insulating film formed over said first word line, and wherein said second word line is formed over said second insulating film.

24. A semiconductor storage device according to claim 23, wherein said bit lines are formed as bit line pairs of a fold-back arrangement connected to said sense amplifiers, respectively.

25. A semiconductor storage device according to claim 23, wherein said first and second word lines are formed over said bit line pairs.

26. A semiconductor storage device according to claim 23, wherein said first and said second word lines are alternately arranged at a constant interval in the horizontal distance.

27. A semiconductor storage device according to claim 23, wherein memory cells are arranged at intersections of one word line of said first and second word lines and one bit line of said bit line pairs.

* * * * *